US007488896B2

(12) United States Patent
Saiki et al.

(10) Patent No.: US 7,488,896 B2
(45) Date of Patent: Feb. 10, 2009

(54) WIRING BOARD WITH SEMICONDUCTOR COMPONENT

(75) Inventors: Hajime Saiki, Aichi (JP); Masahiro Iba, Iwakura (JP)

(73) Assignee: NGK Spark Plug Co., Ltd., Aichi-Ken (JP)

( * ) Notice: Subject to any disclaimer, the term of this patent is extended or adjusted under 35 U.S.C. 154(b) by 540 days.

(21) Appl. No.: 11/265,952

(22) Filed: Nov. 3, 2005

(65) Prior Publication Data

US 2006/0091525 A1 May 4, 2006

(30) Foreign Application Priority Data

Nov. 4, 2004 (JP) ............... 2004-320888

(51) Int. Cl.
*H05K 1/16* (2006.01)
(52) U.S. Cl. ...................... 174/260; 361/767
(58) Field of Classification Search ........... 174/260; 361/767–772; 29/840
See application file for complete search history.

(56) References Cited

U.S. PATENT DOCUMENTS 6,402,013 B2 * 6/2002 Abe et al. ............... 228/223

7,119,003 B2 * 10/2006 Bernier et al. ........... 438/612
2001/0013423 A1 * 8/2001 Dalal et al. ............... 174/260

FOREIGN PATENT DOCUMENTS

JP 2002031889 1/2002

OTHER PUBLICATIONS

Takao et al., "Development of Highly Reliable SnAg Lead-Free Solder Alloy," Toyota Central R&D Labs. Inc., R&D Review, vol. 35, No. 2 (Jun. 2000), including abstract.

* cited by examiner

*Primary Examiner*—Jeremy C Norris
(74) *Attorney, Agent, or Firm*—Kusner & Jaffe

(57) ABSTRACT

An electronic device comprised of a wiring board with a semiconductor component. The device is unlikely to have any defects, such as cracks to a solder joint portion during a reflow process of a flip-chip connection. The semiconductor component is flip-chip bonded at a pad array at a component side thereof to a pad array at a board side by way of an individual solder joint portion. In a solder resist layer at a semiconductor component side and a solder resist layer at a board side, $D/D_0$ is prepared to be in a range of 0.70 to 0.99, where D is a bottom inner diameter of an opening at the board side and $D_0$ is a bottom inner diameter of an opening at the component side.

8 Claims, 5 Drawing Sheets

| D (μm) \ Do (μm) | 110 | 112 | 115 | 119 | 124 | 130 | 137 | 145 | 154 | 164 | 175 |
|---|---|---|---|---|---|---|---|---|---|---|---|
| 110 | 1.0 / — | — | — | — | — | — | — | — | — | — | — |
| 112 | 0.98 / ◎ | 1.0 / — | | | | | | | | | |
| 115 | 0.96 / ◎ | 0.97 / ◎ | 1.0 / — | | | | | | | | |
| 119 | 0.92 / ◎ | 0.94 / ◎ | 0.97 / ◎ | 1.0 / — | | | | | | | |
| 124 | 0.89 / ◎ | 0.90 / ◎ | 0.93 / ◎ | 0.96 / ◎ | 1.0 / — | | | | | | |
| 130 | 0.85 / ○ | 0.86 / ◎ | 0.88 / ◎ | 0.92 / ◎ | 0.95 / ◎ | 1.0 / — | | | | | |
| 137 | 0.80 / ○ | 0.82 / ○ | 0.84 / ○ | 0.87 / ◎ | 0.91 / ◎ | 0.95 / ◎ | 1.0 / — | | | | |
| 145 | 0.76 / △ | 0.77 / ○ | 0.79 / ○ | 0.82 / ○ | 0.86 / ◎ | 0.90 / ◎ | 0.94 / ◎ | 1.0 / — | | | |
| 154 | 0.71 / △ | 0.73 / △ | 0.75 / △ | 0.77 / ○ | 0.81 / ○ | 0.84 / ○ | 0.89 / ◎ | 0.94 / ◎ | 1.0 / — | | |
| 164 | 0.67 / × | 0.68 / × | 0.70 / △ | 0.73 / △ | 0.76 / ○ | 0.79 / ○ | 0.84 / ○ | 0.88 / ◎ | 0.94 / ◎ | 1.0 / — | |
| 175 | 0.63 / × | 0.64 / × | 0.66 / × | 0.68 / × | 0.71 / △ | 0.74 / △ | 0.78 / ○ | 0.83 / ○ | 0.88 / ◎ | 0.94 / ◎ | 1.0 / — |

D/Do / Judgment

US 7,488,896 B2

WIRING BOARD WITH SEMICONDUCTOR COMPONENT

FIELD OF THE INVENTION

The present invention relates to an electronic device comprised of a wiring board with a semiconductor component.

BACKGROUND OF THE INVENTION

Among wiring boards for use in connecting a semiconductor component, such as an integrated circuit (IC) or a large-scale integration (LSI), the so-called organic package substrate comprises a wiring laminated portion and a pad array. The wiring laminated portion includes a plurality of dielectric layers comprised of a polymeric material and a plurality of conductor layers. The plurality of dielectric layers and the plurality of conductor layers are alternately laminated so that the dielectric layer may form a first main surface of the wiring laminated portion. The pad array formed at the board side is comprised of a plurality of metal terminal pads formed on the first main surface, which is formed of said dielectric layer, of said wiring laminated portion. A terminal array is formed at a component side on a second main surface of the semiconductor component. The terminal array is formed of a plurality of terminal pads disposed so as to individually correspond to the plurality of metal terminal pads forming the pad array at the board side. The pad array at the board side and the terminal array at the component side are flip-chip bonded via an individual solder joint portion. The first main surface of the wiring board and the second main surface of the semiconductor component are formed of heat-resistant resin for use in protection from melting solder, and are covered by a solder resist layer having a plurality of openings corresponding to each pad location (e.g., see Japanese Patent Application Laid-Open (kokai) No. 2002-031889, which is fully incorporated herein by reference).

In recent years, the trend of high integration and miniaturization of a semiconductor component has been remarkable, and a clearance between terminals provided on a component side array has also been rapidly reduced. In a flip-chip connection structure where the clearance between the terminals is reduced as mentioned above, cracks caused by stress due to a difference in the coefficient of linear expansion between the semiconductor component and the wiring board are likely to occur in a solder joint portion during a cooling process after reflow heat treatment, thereby leading to a connection failure. For example, when the semiconductor component is an Si integrated circuit, the coefficient of liner expansion is around $4 \times 10^{-6}/°C.$, while the coefficient of linear expansion of a polymeric material that forms a dielectric layer of the wiring board is around $3-4 \times 10^{-5}/°C.$, nearly ten times larger than that of Si. Therefore, there is a concern that the generation of stress caused by the difference in the coefficient of liner expansion therebetween further leads to the occurrence of cracks. Further, in recent years, considering the environmental pollution problem, conventional Sn—Pb eutectic solder has been replaced by solder not containing Pb, referred to as Pb-free solder. Since the Pb-free solder requires a high reflow temperature, there tends to be a high probability of cracks generated in the above-mentioned solder joint portion after the reflow cooling process.

A problem to be solved by the invention is to provide a wiring board with a semiconductor component which is unlikely to cause defects, such as cracks, in the solder joint portion during the reflow process for flip-chip connection.

SUMMARY OF THE INVENTION

In order to solve the above-mentioned problem, there is provided an electronic device according to the present invention comprising:
a wiring board, comprised of (a) a wiring laminated portion including a plurality of dielectric layers comprised of a polymeric material and a plurality of conductor layers, wherein the plurality of dielectric layers and the plurality of conductor layers are alternately laminated so that a dielectric layer may form a first main surface of the wiring laminated portion, (b) a pad array at a board side comprised of a plurality of metal terminal pads disposed on the first main surface, which is formed of the dielectric layer of the wiring laminated portion, and (c) a solder resist layer at the board side provided on the first main surface of the wiring laminated portion and having individually formed openings at the board side so as to expose each metal terminal pad provided on the pad array at the board side; and
an electronic circuit component, comprising a terminal array at a component side provided on a second main surface of the component and formed of a plurality of terminal pads disposed so as to individually correspond to the metal terminal pads that form the pad array at the board side, wherein said pad array at the board side and said terminal array at the component side are flip-chip bonded via each solder joint portion;
wherein D/D0 is prepared to be in a range of 0.70 to 0.99, where D is a bottom surface inner diameter of an opening at the board side and D0 is a bottom surface inner diameter of an opening at the component side.

In a structure where the semiconductor component is flip-chip bonded, if the difference in coefficient of linear expansion between the semiconductor component and the wiring board is not large, thermal stress level generated during a cooling process after reflow will not change dramatically, although a clearance between terminals is reduced. Also, it is unlikely that a frequency of crack occurrence to the solder joint portion may be especially high due to only a scale factor. However, in reality, the narrower the clearance between the terminals becomes, the greater the occurrence of disconnection failures caused by cracks.

However, when reviewing the matter in detail, the following situation has emerged. That is, in the terminal array at the board side positioned downward during reflow, the lower part of the solder joint portion spreads due to influence of melting solder flow, thereby a short circuit generated between adjacent joint portions tends to occur. Thus, in the wiring board having a specifically narrow clearance between the terminals, the design concept has a tendency to facilitate minimized solder flow on the array surface in order to avoid said short circuit. The most effective resolution may be directly demonstrated by reducing the opening size of the solder resist layer at the board side. When such a tendency progresses notably, the opening inner diameter at the board side might be reduced sharply compared to a cross-sectional diameter of the solder joint portion at the semiconductor component side. When the inventors of the present invention reviewed this problem, they found that especially cracks originated near the opening top rim of the solder resist layer tend to extend to the solder joint portion when an unbalanced situation significantly arose, where the opening inner diameter of the solder resist layer becomes small at the board side as mentioned-above. The possible reason for this is that shear stress level causing cracks might become high because a sizable shrinkage due to cooling of the substrate, comprised mainly of polymer material, may be concentrated on the solder joint portion tapered according to the reduced openings of the solder resist layer.

As a result of repeated examinations by the inventors of the present invention, on the assumption that the structure of which the opening inner diameter of the solder resist layer at the substrate side is made small, cracks can be effectively prevented in the solder joint portion originated near the opening of the solder resist layer at the board side, when D/D0 is prepared to be in the range of 0.70 to 0.99, where D is a bottom surface inner diameter of the opening at the board side and D0 is a cross-sectional diameter of the solder joint portion at the semiconductor component side. Thus, the inventors of the present invention came to complete the present invention.

If D/D0 turns out to be less than 0.70, the frequency of crack occurrence in the solder joint portion will become high. When D/D0 exceeds 0.99, the short circuit generated between adjacent solder joint portions will not be effectively prevented. Thus, D/D0 is preferably in the range of 0.70 to 0.97, more preferably 0.80 to 0.95.

Effect of the present invention is particularly demonstrated when the solder joint portion is formed from a combination of a plurality of solder portions each made of a different composition. That is, discontinuous interface of metallographic structure, especially cracks due to thermal stress, is likely to occur in a boundary between solders each made of a different composition. However, the present invention drastically enables the prevention of cracks, even though the discontinuous interface is generated. Specifically, when the solder joint portion formed from a plurality of solders comprises (a) a first solder portion contacting the terminal at the board side and (b) a second solder portion contacting the first solder portion and the terminal at the component side, the second solder portion having a higher melting point than that of the first solder portion, the discontinuous interface of metallographic structure is likely to occur between the second solder portion at the component side having a high melting point and the first solder portion at the board side having a low melting point. Therefore, the application of the present invention, specifically, demonstrates the effectiveness.

DETAILED DESCRIPTION OF PREFERRED EMBODIMENTS

Hereinafter, preferred embodiments of the present invention are explained with reference to the drawings.

Figure 1:
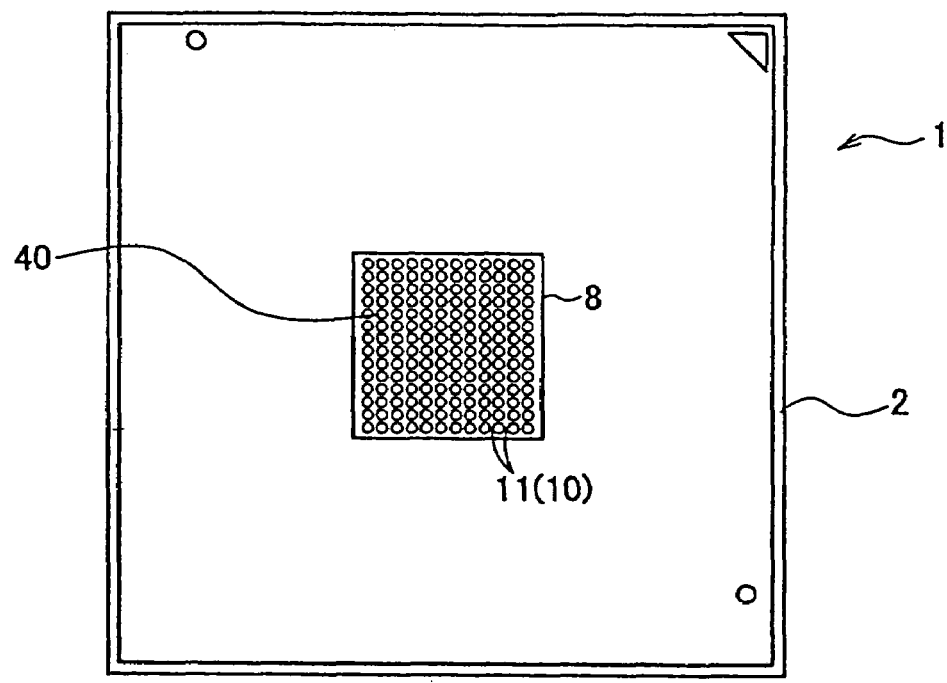
FIG. 1 is top plan view showing one embodiment of the wiring board.
Figure 3:
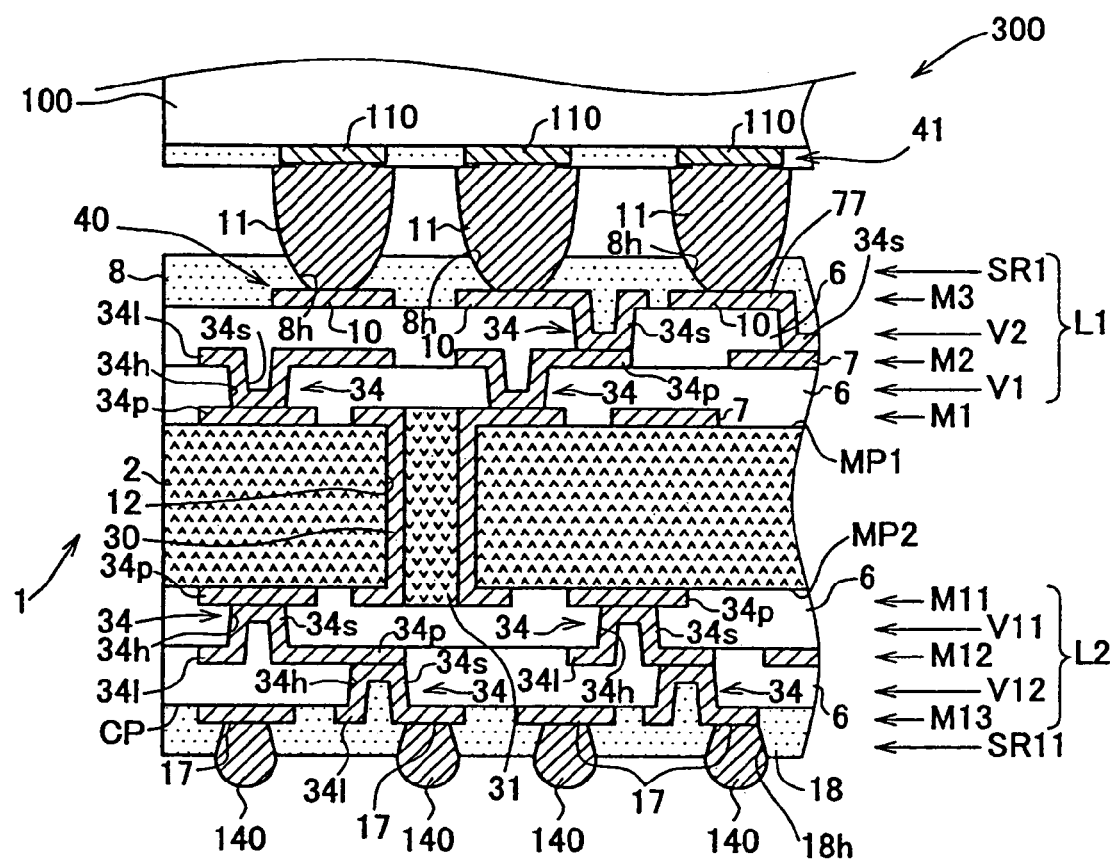
FIG. 3 is an illustration showing an example of the cross-sectional structure of the wiring board with a semiconductor component according to the present invention.

FIG. 3 shows a frame format of a cross sectional structure of a wiring board 300 with a semiconductor component according to an embodiment of the present invention. First, a wiring board 1 comprises a wiring laminated portion L1 including dielectric layers V1, V2 comprised of a polymer material and conductor layers M1, M2, M3, wherein the dielectric layers V1, V2 and the conductor layers M1, M2 are alternately laminated so that the dielectric layer V2 may form a first main surface of the wiring laminated portion L1. On the first main surface of the wiring laminated portion L1 formed of the dielectric layer V2, a plurality of metal terminal pads (hereinafter referred to as first pads at the board side or simply first pads) 10 are disposed in a lattice pattern (or a zigzag pattern) to form a pad array at a board side 40, as shown in FIG. 1.

As shown in FIG. 3, on the first surface of the wiring laminated portion L1, a solder resist layer 8 at the board side having openings 8h at the board side are formed so as to expose each first pad (metal terminal pad) 10 of the pad array 40 at the board side. On the other hand, a semiconductor component 100 is flip-chip bonded to the pad array 40 at the board side via solder joint portions 11. The semiconductor component 100 is a silicone integrated circuit component. On a second main surface of semiconductor component 100, there is a pad array 41 at the component side comprised of a plurality of terminal pads (hereinafter referred to as component side pads) 110 disposed so as to individually correspond to the metal terminal pads 10 that form the pad array 40 at the board side. The semiconductor component 100 is flip-chip bonded at the terminal array 41 thereof to the pad array 40 at the board side via each solder joint portion 11.

Hereinafter, the details of the structure of the wiring board 1 are further explained. The wiring board 1 has a plate-like core 2 comprised of a heat-resistant resin plate (e.g. bismaleimide-triazine resin plate) or a fiber reinforced resin plate (e.g. glass fiber reinforced epoxy resin) etc. Core conductor layers M1, M11 are respectively formed on both surfaces of the plate-like core 2, and form a wiring metal layer in a predetermined pattern. The core conductor layers M1, M11 are formed as surface conductor patterns to cover the large portion of the surfaces of plate-like core 2 and are also used as a power supply layer or a grounding layer. On the other hand, a through-hole 12 formed by drill etc. is provided in the plate-like core 2. A through-hole conductor 30 is formed on the inner wall surface of the through-hole 12 so that the core conductor layers M1 and M11 are electrically connected. Further, the through-hole 12 is filled with resinous filler 31, such as an epoxy resin.

Further, first via layers (build-up layer: dielectric layer) V1, V11, comprised of a photosensitive resin composition 6, are formed on the core conductor layers M1, M11, respectively. Furthermore, on the surfaces of first via layers V1, V11, first conductor layers M2, M12, each having a metal wiring 7, are formed by Cu plating. In addition, the core conductor layers M1, M11 and the first conductor layers M2, M12 are interlayer connected through via 34, respectively. Similarly, second via layers (build-up layer: dielectric layer) V2, V12, comprised of photosensitive resin composition 6, are formed, respectively on the first conductor layers M2, M12. Second conductor layers M3, M13 each having metal terminal pads 8, 18 are formed on the surfaces of the second via layers V2, V12. The first conductor layers M2, M12 and the second conductor layers M3, M13 are interlayer connected through via 34, respectively. As shown in FIG. 3, the via 34 includes a via hole 34h, a via conductor 34s provided on the inner surface thereof, a via pad 34p formed so as to be electrically connected to the via conductor 34s at the bottom surface, and a via pad 34*l* projected outward from the opening circumference of the via conductor 34*s* at a opposite side of the via pad 34*p*.

Figure 2:
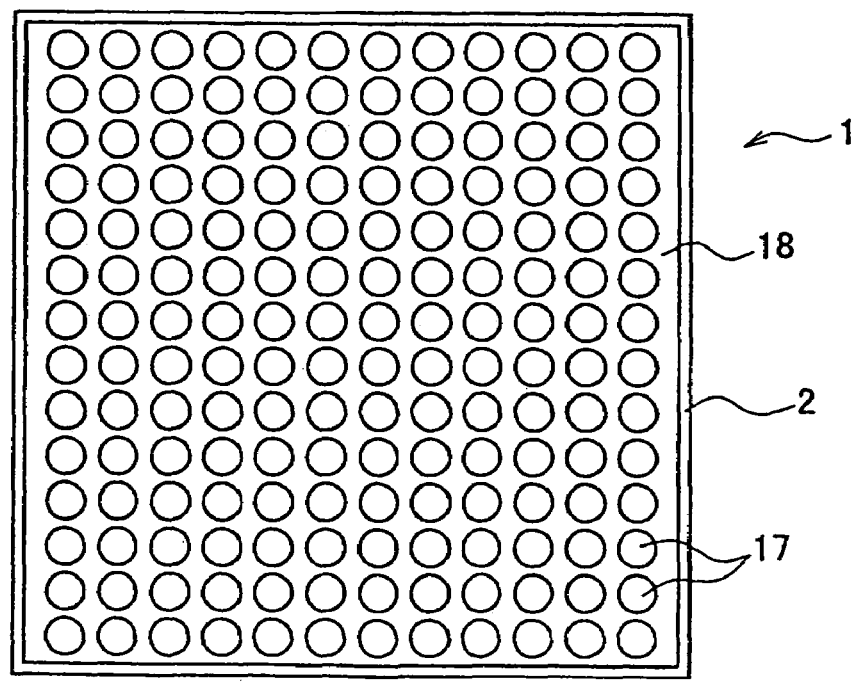
FIG. 2 is a bottom plan view of the wiring board of FIG. 1.

In a first main surface MP1 of the plate-like core 2, the core conductor layer M1, the first via layer V1, the first conductor layer M2 and the second via layer V2 constitute the first wiring laminated portion L1. Also, in a second main surface MP2 of the plate-like core 2, the core conductor layer M11, the first via layer V11, the first conductor layer M12 and the second via layer V12 constitute a second wiring laminated portion L2. In both wiring laminated portions L1 and L2, the dielectric layers and the conductor layers are alternately laminated so that the dielectric layer 6 may form each main surface CP of the wiring laminated portions L1, L2, and a plurality of metal terminal pads 10 or 17 are formed thereon. The metal terminal pads 10 provided on the first wiring laminated portion L1 constitute solder pads for flip-chip bonding to an integrated circuit component etc. Further, the metal terminal pads 17 provided on the second wiring laminated portion L2 are used as bottom surface pads for connecting the wiring board itself to a motherboard etc. by way of pin grid array (PGA) or ball grid array (BGA). As shown in FIG. 2, the second pads 17 provided on the second conductor layer M13 are also disposed in a lattice pattern. Solder resist layers 8, 18 (SR1, SR11) comprised of a photosensitive resin composite are formed, respectively, on each of the second conductor layers M3, M13. In order to expose the first pads 10 or the second pads 17, openings 8*h*, 18*h* corresponding to each pad are formed.

The via layers V1, V11, V2, V12 and the solder resist layers 8, 18 are, for example, manufactured as follows. That is, the photosensitive adhesive films, where photosensitive resin composite varnish is processed to a film, are laminated. Then, a transparent mask (e.g. a glass mask) having a pattern corresponding to the via holes 34*h* is overlapped thereon and an exposure process is conducted. In the exposure process, the film except for the portion of the via holes 34*h* is cured. After unhardened portion of the film is dissolved in an agent, via holes 34*h* in a predetermined pattern can be easily formed (i.e. photo via process).

The first main surface of the first wiring laminated portion L1 and the second main surface of the second wiring laminated portion L2 are covered with solder resist layers 8, 18, respectively. Inner circumference of the openings 8*h*, 18*h* of said solder resist layers 8, 18 are positioned inward of the outer circumference of the metal terminal pads 10, 17.

Figure 4:
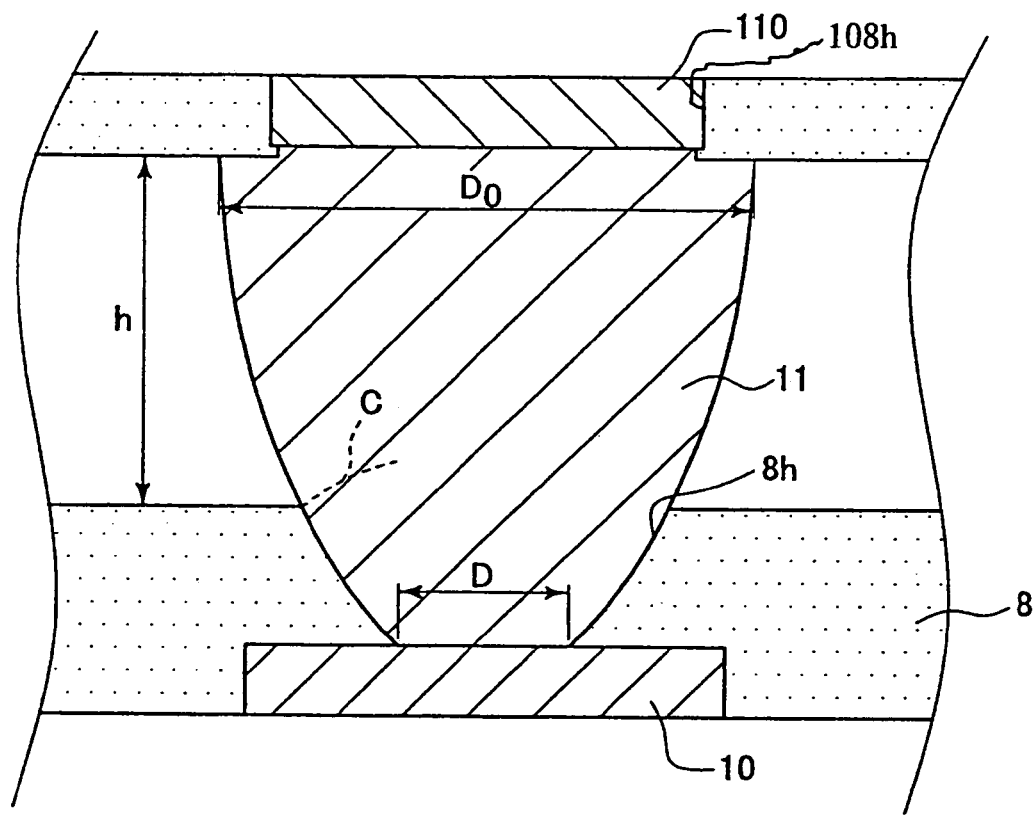
FIG. 4 is an enlarged sectional view showing a frame format of solder joint structure.

As shown in FIG. 4, D/D0 is selected to be in the range of 0.70 to 0.99 (preferably 0.70 to 0.97, more preferably 0.80 to 0.95: e.g. 0.92) where D is a bottom inner diameter of the opening 8*h* at the board side and D0 is a cross-sectional diameter of the solder joint portion 11 at the semiconductor component side. Further, as for the openings 8*h* at the board side and the terminal pads 110 at the component side, the inner diameters thereof are prepared, for example, to be in the range of 100 µm to 150 µm. Also, a clearance between the terminals (distance between the centers of adjacent openings) is, for example, in the range of 200 µm to 400 µm.

When the semiconductor component 100 is flip-chip bonded to the wiring board 1 via solder joint portions 11, the solder reflow heat treatment for forming the solder joint portions 11 is conducted. The temperature of said reflow heat treatment is established to be higher than the melting point of the solder forming the solder joint portion 11. Where the melting point is Tm, and where the reflow temperature is Tm+ΔT, ΔT is normally established to be 1° C. or more to 100° C. or less. In FIG. 4, the entire solder joint portion 11 is comprised of single material of Sn-system solder. For example, the solder joint portion 11 is formed in such a manner that a solder pattern is printed on the openings 8*h* at the board side using solder paste, or solder balls are installed on the openings 108*h* at the component side in advance. While locating the openings 8*h* at the board side to the associated openings 108*h* at the component side, the semiconductor component 100 is mounted on the wiring board 1. Subsequently, thus-mounted body is put in a reflow furnace in order to melt the solders and then cool it down, thereby completing the solder joint portion 11.

By making the bottom inner diameter D of the opening 8*h* at the board side smaller than the cross-sectional diameter D0 of the solder joint portion 11 at the semiconductor component side, the lower part of the solder joint portion 11 is prevented from spreading due to the influence of melting solder flow, and the short circuit occurring between adjacent joint portions 11 may be effectively prevented. However, if the bottom inner diameter D of the opening 8*h* at the board side is made extremely smaller than the cross-sectional diameter D0 of the solder joint portion 11 at the semiconductor component side, cracks C originated near the opening top rim of the solder resist layer 8 and extended to the solder joint portion 11, tend to occur during a cooling process after reflow. However, if D/D0 is prepared to be in the range of 0.70 to 0.99 as mentioned-above, even though it is in the state of D<D0, the occurrence of cracks C will be effectively prevented.

Further, the opening 8*h* at the board side preferably has a distance of 160 µm or more to 400 µm or less center-to-center between the most adjacent centers. If the distance is less than 160 µm center-to-center, the joint strength of the solder joint portion 11 tends to lessen, thereby causing occurrence of cracks. Furthermore, a positioning process of the opening 8*h* at the board side and the opening 108*h* at the component side will become difficult when mounting the semiconductor component 100 on the wiring board 1, whereby a positioning failure is likely to occur.

However, the center-to-center distance is preferably 180 µm or less. If the distance between terminals becomes fine pitch, the design freedom of the wiring will increase. Here, the center-to-center distance needs to be greater than the diameter of the opening 8*h* at the board side and preferably greater than the inner diameter thereof by 30 µm or more, considering a short circuit generated between adjacent solder joint portions.

Although the solder joint portion 11 can be formed of Sn—Pb eutectic solder, the solder not containing Pb, referred to as Pb-free solder, has been used instead of the conventional Sn—Pb eutectic solder due to concern for the recent environmental pollution problem. Similar to the conventional eutectic solder, many of the Pb-free solders include Sn as a main component and Ag, Cu, Zn, Bi etc. as a sub-component, instead of Pb used in many eutectic solders. Solder whose sub-component is mainly comprised of at least one of these elements with some amount of Pb is still employed as a compromise.

Specifically, the solder joint portion 11, a whole or a part thereof, can be Sn-system high temperature solder portion comprised of Sn alloy having a liquidus temperature at 200° C. to less than 232° C. Sn—Pb eutectic solder has a eutectic composition of Sn-38 mass % Pb, with a melting point at 183° C. Even if this composition shifts to either Pb rich side or Sn rich side, the melting point (liquidus) of the alloy rises. Simplex Sn metal is a solder that is equivalent to the foregoing solder where the entire Pb substance has been simply removed from the Sn—Pb eutectic solder. Simplex Sn metal has a melting point at 232° C., which is higher than that of the Sn—Pb eutectic solder by about 50° C. Therefore, it is difficult to adopt the simplex Sn metal as an alternative solder.

In this case, an adoptable Sn-system high temperature solder portion may include Sn as a main component (i.e. content: more than 62 mass % in eutectic solder), and the main body of eutectic formation component thereof can be selected from the elements other than Pb. When a solder member is comprised of Sn alloy having very low Pb content compared to Sn—Pb eutectic solder, the melting point of solder inevitably exceeds 200° C. (Max: 232° C. in simplex Sn substance) which is regarded as a high temperature solder. For example, in the Pb-free solders with, various compositions as listed in Table 1 of "Development of Highly Reliable Sn—Ag Lead-Free Solder Alloy" by Toyota Central Lab., Inc. R&D Review Vol. 35 No. 2 (2000) Page 39, which is fully incorporated herein by reference, the melting points Ts (liquidus temperature) thereof are all at 200° C. or more. In light of environmental protection, Sn alloy constituting the above-mentioned high temperature solder member preferably has a Pb content of below 5 mass % (more preferably, below 1 mass %, most preferably, as little as possible except for an unavoidable impurities level).

In Sn-system high temperature solder, the sub-component added to Sn should have the following conditions: a large effect on reducing the melting point; a reasonable price or if it is expensive, only a little addition is required; good solderability and wettability; and an excellent corrosion resistance. However, unexpectedly, the types of sub-components satisfying such conditions having a good balance is limited, and only some elements, such as Zn, Bi, Ag, Cu can meet said conditions. A Sn—Zn-system has a eutectic point of about 15 mass % Zn, and the melting point thereof falls to about 195° C. with this composition. However, since Zn does not have good corrosion resistance, it can normally retain the addition of around 7-10 mass %, the melting point thereof only falls to around 215° C. in the duality-system of such composition or the like. Then, although Bi of 1-5 mass % is added to control the melting point, it is difficult to achieve the melting point of less than 200° C. after all. Furthermore, since Bi is expensive and a strategic substance, it is hard to maintain the stability of supply.

On the other hand, a single element of Ag or Cu has a much higher melting point than that of Sn. The eutectic point of Sn—Ag system exists in about 5 mass % Ag of the Sn rich side and that of Sn—Cu system exists in about 2 mass % Cu of the Sn rich side. Moreover, Ag—Cu system is also a eutectic system and the melting point can be further lowered by a ternary eutectic of Sn—Ag—Cu. However, each of the Sn—Ag system and the Sn—Cu system has the duality eutectic melting point of around 220° C. Although the ternary eutectic is adopted, it is difficult to lower the melting point at 200° C. or less. In addition, in view of lowering the melting point, the recommended composition for Sn—Ag system alloy is that Ag content to Sn is 3 mass % or more to 6 mass % or less. Similarly, as for Sn—Cu system alloy, Cu content to Sn is 1 mass % or more to 3 mass % or less. Furthermore, in the case of Sn—Ag—Cu alloy, Ag+Cu is 3 mass % or more to 6 mass % or less, and Cu/(Ag+Cu) is 0.1 or more to 0.5 or less in a mass ratio. Any case, the melting point of the solder is at 200° C. or more.

When a whole solder joint portion 11 is made of the above-described Sn-system high temperature solder portion, a thermal stress level tends to be high, whereby, cracks C are likely to occur due to poor ductility of Sn-system high temperature solder compared to Sn—Pb eutectic solder and an increase in its reflow temperature. Therefore, the present invention can significantly demonstrate an effective prevention of crack C generation.

Figure 6:
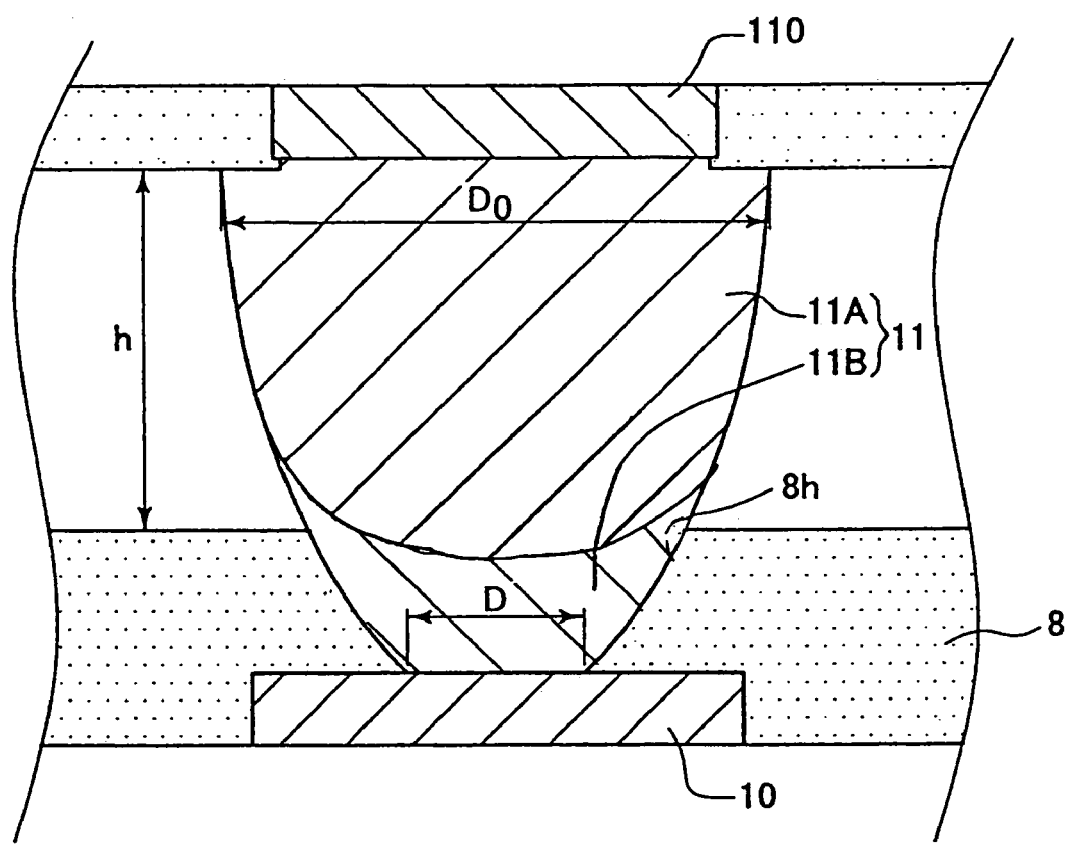
FIG. 6 is an enlarged sectional view showing a frame format of solder joint structure obtained by the method of FIG. 5.

Next, as shown in FIG. 6, the solder joint portion 11 can be formed such that only a part of the solder joint portion 11 comprises a Sn-system high temperature solder portion 11A and the remaining portion 11B thereof may be formed of low temperature solder having a lower melting point than that of the Sn-system high temperature solder portion. In this case, a systematic discontinuity at the boundary between the solder portions 11A and 11B is likely to occur and cracks at the boundary tends to extend. Thus, cracks may be effectively prevented by the present invention.

Specifically, the solder joint portion 11 fills the opening 8h at the board side and may be comprised of: the Sn-system low temperature solder portion 11B comprised of Sn alloy having a lower melting point compared to that of Sn-system high temperature solder portion 11A; and the Sn-system high temperature solder portion 11A constituting the remaining portion of Sn-system low temperature solder portion 11B in the solder joint portion 11. In this case, since the type and content of the components other than Sn included in the solder portions 11A and 11B are vastly different, it is likely to cause a systematic discontinuity in the boundary of the solder portions. Therefore, the present invention can especially demonstrate its ripple effect on the prevention of cracks.

Figure 5:
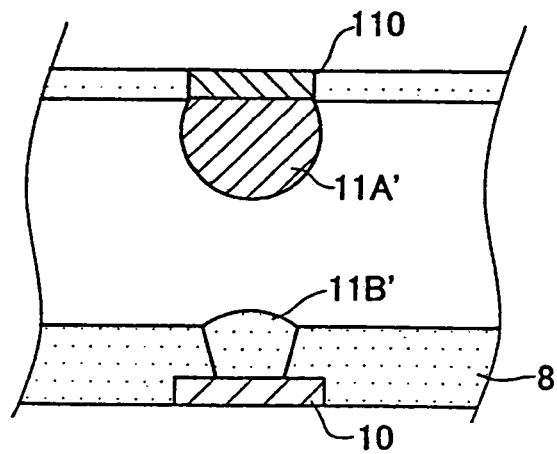
FIG. 5 is a pattern diagram showing the modification of the formation method of the solder joint structure.

The Sn-system low temperature solder portion 11B can be comprised of Sn—Pb eutectic solder. Sn—Pb eutectic solder has low reflow temperature and a good wettability. For example, as shown in FIG. 5, Sn-system high temperature solder portion 11A' is formed in advance on the opening 108h at the component side. On the other hand, Sn—Pb eutectic solder paste is filled in the opening 8h at the board side by printing etc. to form auxiliary solder portion 11B' for joint. As a result, in the whole solder joint portion 11 after reflow process shown in FIG. 6, the amount of Sn-system low temperature solder portion with high Pb-content used can be sharply reduced. Further, the reflow temperature can be kept low in spite of mainly using Sn-system high temperature solder. However, since an eutectic component other than Sn in Sn—Pb eutectic solder is formed mainly of Pb having high specific gravity and its amount contained is greater than that of Sn-system high temperature solder, the systematic discontinuity between Sn-system high temperature solder portion 11A and Sn—Pb eutectic solder portion 11B is likely to occur. There is also a tendency for cracks to be generated at the boundary thereof. Therefore, the effect of the present invention is more advantageously demonstrated.

Figure 7:
FIG. 7 is a table showing the results of the experiment performed in order to confirm the effect of the present invention.

The following experiments were conducted in order to confirm the effect of the present invention. Some wiring board samples having the features described with reference to FIGS. 1-3 were produced. Each of the samples had 3500 pads disposed in a lattice pattern and the solder joint portion 11 thereof had a height h of 80 μm with the clearance of 200 μm. The sizes of cross-sectional diameters D0 of the joint at the component side and the bottom inner diameters D of the opening 8h at the board side varied from 110 μm to 175 μm, respectively. In addition, while Sn—Pb eutectic solder paste was applied on the pads 10 at the board side, the Pb-free solder bumps having a ternary composition of Sn—Ag—Cu were used for the semiconductor component side, which is comprised of silicone integrated circuit components, and they were flip-chip bonded by reflow at a temperature of 227° C. Then, the component and the substrate that had been bonded were cut perpendicularly along the centerline (60 pieces) of the solder joint portion disposed in the lattice pattern and were ground. Subsequently, the state of cracks generated inside of each solder joint portion is observed by an optical microscope. Cracks observed in the entire sectional surface of the joint portion is classified as mode A, cracks observed in less than half of the entire sectional surface is classified as mode B and cracks observed only at the end of the joint portion is classified as mode C. Judgment was determined based on the following: no crack classified as mode A-C regarded as excellent (◎); no crack classified as mode A and B, but detected a crack in mode C regarded as good(O); 2 to 5 cracks classified in mode C is acceptable (Δ); and cracks classified as either mode A or B regarded as not good (x). The foregoing results are shown in FIG. 7. It is obvious from the result that good results were obtained when D/D0 is between 0.70 and 0.99. Further, when D/D0 was 1 or more, the samples having a short circuit were observed.

Other modifications and alterations will occur to others upon their reading and understanding of the specification. It is intended that all such modifications and alterations be included insofar as they come within the scope of the invention as claimed or the equivalents thereof.

DESCRIPTION OF REFERENCE NUMERALS

1: wiring board
8: solder resist layer at the board side
8h: opening at the board side
10: first pad (metal terminal pad)
11: solder joint portion
40: pad array at the board side
41: pad array at the component side
100: semiconductor component
108: solder resist layer at the component side
110: metal terminal pad Having described the invention, the following is claimed:

1. An electronic device comprising:
   a wiring board which comprises:
   (a) a wiring laminated portion including: a plurality of dielectric layers comprised of a polymeric material and a plurality of conductor layers, wherein the plurality of dielectric layers and plurality of conductor layers are alternately laminated so that one of said plurality of dielectric layers may form a first main surface of said wiring laminated portion,
   (b) a pad array at a board side comprised of a plurality of metal terminal pads disposed on the first main surface, which is formed of said dielectric layer of said wiring laminated portion, and
   (c) a solder resist layer at the board side provided on the first main surface of said wiring laminated portion and having one or more individually formed openings at the board side so as to expose said metal terminal pads disposed on said pad array at the board side; and
   a semiconductor component comprising a terminal array at a semiconductor component side provided on a second main surface of the component and comprising a plurality of terminal pads disposed so as to individually correspond to said metal terminal pads constituting said pad array at the board side,
   wherein said pad array at the board side and said terminal array at the component side are flip-chip bonded via one or more solder joint portions;
   wherein D/D0 is in a range of 0.70 to 0.99, where D is a bottom surface inner diameter of at least one of said openings at the board side in said solder resist layer and D0 is a cross-sectional diameter of at least one of said solder joint portions at the semiconductor component side.

2. The electronic device as claimed in claim 1, wherein D/D0 is in a range of 0.70 to 0.95.

3. The electronic device as claimed in claim 1, wherein there are a plurality of said openings at the board side, wherein said openings at the board side have a distance of 160 μm or more to 400 μm or less center-to-center between adjacent openings.

4. The electronic device as claimed in claim 1, wherein each said solder joint portion is formed from a combination of a plurality of solder portions each made of a different composition.

5. The electronic device as claimed in claim 4, wherein said plurality of solder portions comprising said solder joint portion comprises:
   a first solder portion contacting said pad array at the board side; and
   a second solder portion contacting said first solder portion and said terminal array at the component side, said second solder portion having a higher melting point than that of the first solder portion.

6. The electronic device as claimed in claim 1, wherein at least a part of each said solder joint portion is formed of a Sn-system high temperature solder portion comprised of a Sn alloy having a liquidus temperature at 200° C. to less than 232° C.

7. The electronic device component as claimed in claim 3, wherein each said solder joint portion fills said openings at the board side, and is formed of:
   a Sn-system low temperature solder portion, and a Sn-system high temperature solder portion constituting a remaining portion of said solder joint portion, wherein said Sn-system low temperature solder portion is comprised of a Sn alloy having a lower melting point than that of said Sn-system high temperature solder portion.

8. The electronic device as claimed in claim 4, wherein at least one of said plurality of solder portions includes a Sn-system low temperature solder portion formed of Sn-Pb eutectic solder.

* * * * *